United States Patent [19]

Benko et al.

[11] Patent Number: 5,021,630
[45] Date of Patent: Jun. 4, 1991

[54] LASER SOLDERING METHOD AND APPARATUS

[75] Inventors: John W. Benko, Trenton; Alexander Coucoulas, Basking Ridge, both of N.J.

[73] Assignee: AT&T Bell Laboratories, Murray Hill, N.J.

[21] Appl. No.: 517,795

[22] Filed: May 2, 1990

[51] Int. Cl.$^5$ .............................................. B23K 26/00
[52] U.S. Cl. ............................ 219/121.64; 219/85.12; 219/121.78
[58] Field of Search ....................... 219/121.63, 121.64, 219/85.12, 121.6, 121.85, 121.78, 121.8

[56] References Cited
U.S. PATENT DOCUMENTS 3,283,124  11/1966  Kawecki ...................... 219/85.12 X
3,463,898  8/1969  Takaoka et al. ................ 219/121.63
3,586,813  6/1971  Cruickshank et al. ........... 219/85.12
4,785,156  11/1988  Benko et al. ................... 219/121.64

*Primary Examiner*—C. L. Albritton
*Attorney, Agent, or Firm*—R. B. Anderson

[57] ABSTRACT

An electronic device (10) is surface mounted to bonding pads (11) of a substrate (12) by first mounting the device within an aperture (24) of a glass plate (17). The leads (14) of the electronic device are coated with solder and pressed onto the bonding pads by the reusable glass plate (17). While pressing the plate against the leads, the plate is scanned with a laser beam (16) directly over each row of bonding pads. The laser light is of an appropriate wavelength such that the glass plate converts the laser light to heat, which melts the solder to bond the leads to the bonding pads.

14 Claims, 2 Drawing Sheets

LASER SOLDERING METHOD AND APPARATUS

TECHNICAL FIELD

This invention relates to processes for bonding conductors to bonding pads of a substrate.

BACKGROUND OF THE INVENTION

Electronic systems are typically made by defining complex integrated circuits on semiconductor chips, bonding the chips to circuit package substrates, and in turn bonding the packages to printed circuit boards. The most common bonding technique is wire bonding, in which an instrument (a thermode) thermo-compression bonds wires to a bonding pad of one element, such as a chip, and then pulls the wire and makes a bond on a bonding pad of a second element so as to form an arcuate self-supporting wire bridge between the two bonding pads. An alternative technique that is rapidly coming into increased use is known as reflow soldering or surface mounting, in which the leads of a device are "tinned" with solder and placed on an array of bonding pads. Heat is then applied to melt or reflow the solder between the leads and the bonding pads to make a solder bond.

Direct heating of circuit assemblies to melt or reflow the solder has been applied, for example, by hot air convection and by infrared heating. A disadvantage of such techniques is that the entirety of the unit, including active elements of the chip, must be heated to a temperature above the melting point of the solder. To avoid this and to localize the heating, laser beam soldering has been proposed, in which the heat is applied by a laser beam directed against leads overlying the bonding pads. Differences in absorption and reflectivity resulting from differing surface properties may create problems; also, it may be difficult to position the beam with the required accuracy; finally, the laser beam may burn or char the substrate.

The need for easier methods for surface mounting devices on substrates is expected to become greater as the density of circuits on integrated circuit chips increases. As the number of leads extending from chips and chip carriers increases, it becomes more difficult to use surface mount techniques to solder them with consistency and uniformity. One advantage that thermal compression bonding has had over reflow solder techniques is that it applies a uniform compressive force to each lead that is being soldered, whereas, with reflow soldering, different leads may rest with different degrees of force on the different bonding pads. With either method, as density increases it becomes more difficult to align precisely the leads with the bonding pads.

Some, but not all, of these considerations are addressed in U.S. Pat. No. 4,785,156 to Benko et al., which shows the use of a fused silica member overlying pretinned leads to be soldered. A laser beam impinging on the silica member is converted to heat, which is sufficient to reflow the solder and effect a solder bond.

SUMMARY OF THE INVENTION

The invention is an improvement of a method for surface mounting an electronic device having a plurality of leads extending from it in a cantilever fashion. The free ends of the leads are tinned and aligned with a row of bonding pads such that each lead overlies a bonding pad. The leads are then pressed onto the bonding pads with a glass plate that bridges the leads of an array and forces each of them into contact with a corresponding bonding pad. While the plate presses against the leads, the plate is scanned with a laser beam along a line directly over the row of bonding pads. The laser light is of an appropriate wavelength such that the glass plate converts the laser light to heat, which melts the solder to effect a bond. Since the glass plate is transparent to visible light, the operator can look through it to align the leads with the bonding pads.

According to another feature, an aperture is made in the glass plate, and the electronic device is mounted in the aperture such that opposite sides of the aperture compress opposite lead arrays of the device; in this manner, the electronic device can be held within the aperture by friction. The operator can then manipulate the plate to align the leads with the bonding pads. Additionally, two or more electronic devices can be held within two or more apertures in the glass plate to permit simultaneous registration of the various lead arrays with corresponding bonding pad arrays of the substrate. After the soldering operation, a stopper element is abutted against the electronic device to permit the withdrawal of the glass plate without affecting the solder bonds.

It will be appreciated that the invention lends itself well to either manual or robotic placement of electronic devices onto substrates with the leads precisely positioned on bonding pads. During the reflow operation, the glass plate bears down on the lead array and compresses it against a bonding pad array with a substantially uniform force. This is a significant improvement over other surface mount techniques in which a lead that is accidentally bent upwardly with respect to other leads of the array may not touch the bonding pad sufficiently to insure a reliable bond. These and other features, benefits and advantages of the invention will be better understood from a consideration of the following detailed description taken in conjunction with the accompanying drawing.

DETAILED DESCRIPTION

Figure 1:
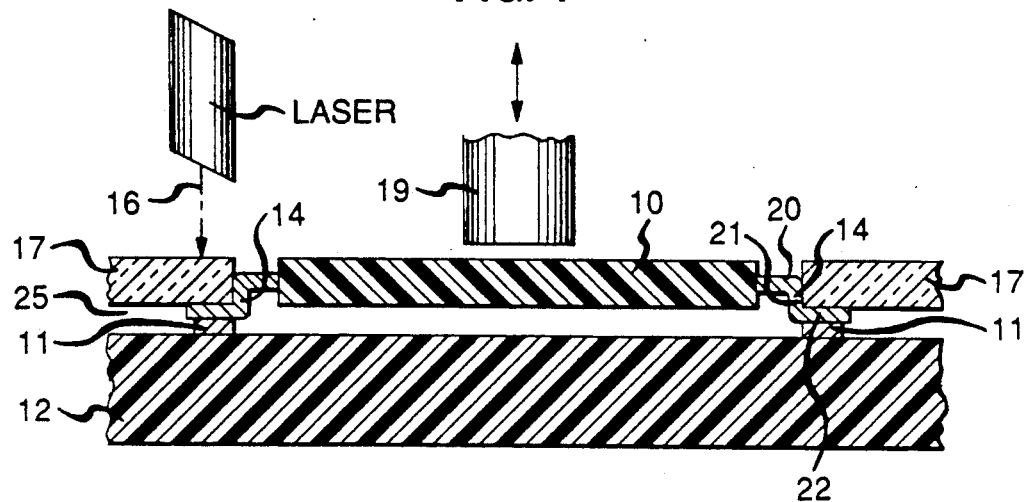
FIG. 1 is a schematic view of apparatus for practicing a soldering process in accordance with an illustrative embodiment of the invention.
Figure 2:
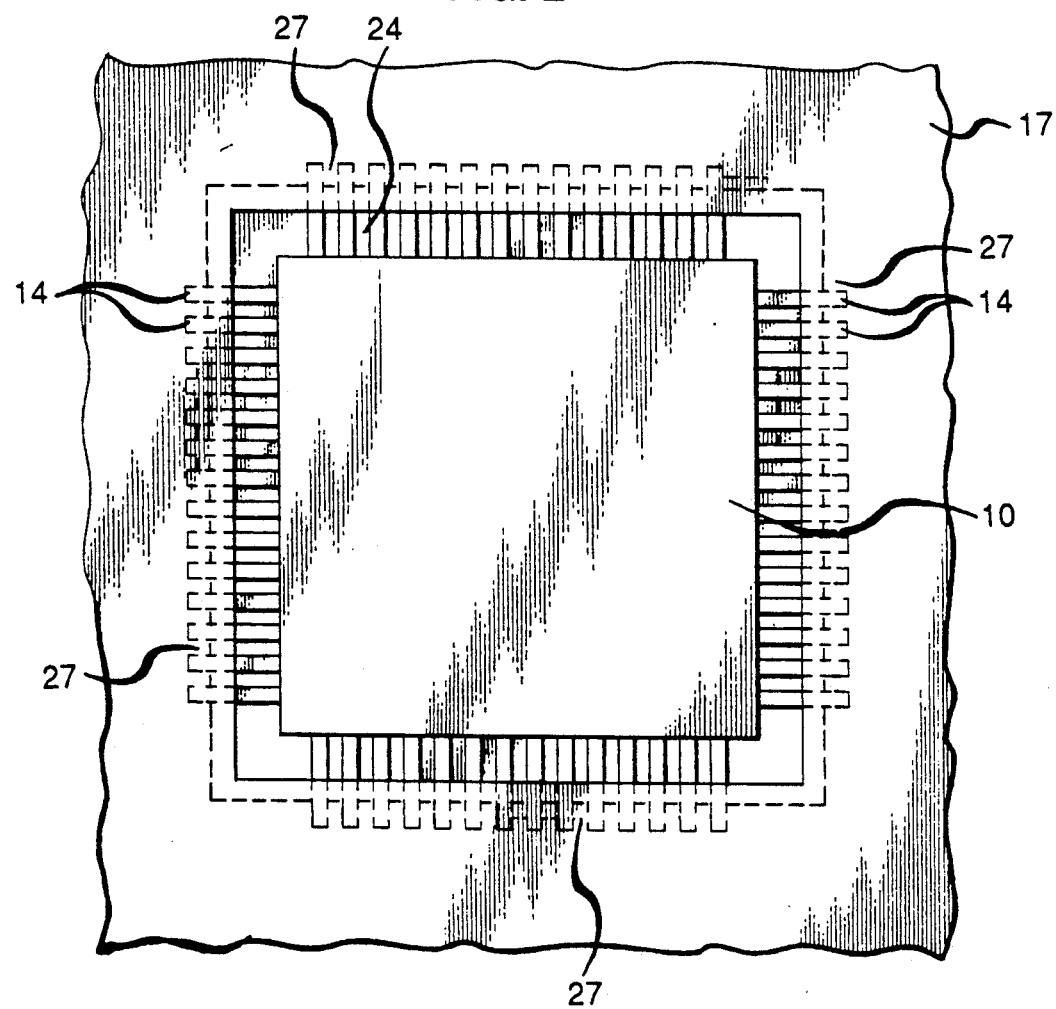
FIG. 2 is a top view of the apparatus of FIG. 1.

Referring now to FIGS. 1 and 2, there is shown an electronic device 10, which may be an encapsulated semiconductor chip, which is to be soldered to bonding pads 11 of a substrate 12. Substrate 12 may be a circuit package substrate or, alternatively, electronic device 10 can be a circuit package and substrate 12 can be a printed circuit board. Each bonding pad 11 constitutes part of a circuit on the substrate which, for brevity, has not been shown. The electronic device 10 contains electrical leads 14 which have been "tinned"; that is, their surfaces opposite the bonding pads have been coated with solder.

In accordance with the invention, the solder coatings are melted and the leads 14 are soldered to bonding pads 11 by directing a laser beam 16 to impinge on a glass plate 17. The glass plate absorbs the laser beam 16 and converts it to heat without itself becoming significantly damaged. The heat in turn is conducted to leads 14 and is sufficient to melt the solder coatings on the leads. After the solder operation, a stopper member 19 is abutted against the electronic device 10 so that glass plate 17 can be removed without impairing the soldered joints. Thereafter, the glass plate can be reused for other solder operations.

As is customary in the fabrication of integrated circuit devices, the leads 14 contain first and second substantially right angle bends. A first lead portion 20 extends from the electronic device to the first right angle bend, a second lead portion 21 interconnects the first and second right angle bends, and a third lead portion 22 extends from the second right angle bend and makes contact with a bonding pad. As shown in FIG. 2, an aperture 24 is defined in the glass plate 17. The aperture is fitted around the electronic device 10 such that inner surfaces of the plate defining the aperture abut against second lead portions 21 of the leads 14. The aperture is sized such as to compress slightly opposite arrays of leads when the aperture is fitted around the lead arrays. The leads are sufficiently spring-like, and have a sufficient Young's modulus within the elastic limit, that the electronic device can be held by friction within the aperture. As a consequence, the glass plate 17 can be used as a holder of the electronic device 10 and can be manipulated by an operator to align the leads 14 with respect to corresponding bonding pads 11. The glass plate is transparent to visible light so that the operator can see through it to align the leads with the bonding pads.

After alignment has been made, a downward force is preferably exerted on the glass plate 17 which presses each lead 14 firmly against a corresponding bonding pad 11. Thus, if any of the leads of the array is bent slightly upwardly, it will, nevertheless, be forced into firm contact with a bonding pad. Encapsulated integrated circuit chips presently being used typically have 24 leads extending from each of its four sides, and so the likelihood is fairly great that one of the cantilevered free ends might be slightly bent so as to prevent it from fully contacting a bonding pad in the absence of any compressive force. Another advantage of the applied pressure is that the amount of solder for making the bond can be minimized. With conventional surface mount, if one uses a sufficiently thick solder coating to assure a bond to all bonding pads, one may run the risk of excessive solder causing a spurious short-circuit between adjacent bonding pads.

The light beam 16 is typically generated by a carbon dioxide laser emitting light with a CW power of about fifteen watts at a predominant wavelength of 10.6 microns. Fused silica glass is sufficiently absorbent of such wavelength so as to convert it to heat in accordance with an illustrative embodiment of the invention. A glass plate which 17 has been used experimentally has a thickness of forty mils, which provides structural strength along with an appropriately short path for heat conduction to each lead. As the sizes of devices are further miniaturized, it is to be expected that the preferred values for laser power and glass thickness will also drop. It is expected that practical glass thicknesses will be between about five and forty mils. The thickness of the bonding pads and leads provides an inherent gap 25 between the glass plate 17 and the substrate 12 so as to prevent a significant heating of the substrate by the glass plate. Experiment shows that with apparatus of the type shown, the heat applied to substrate 12 is insufficient to damage a conventional printed circuit board made of glass filled with epoxy.

As shown in FIG. 2, the beam 16 scans the glass plate 17 along scan lines 27 to provide heat for the solder bond. Apparatus for causing a laser beam to scan in a controlled manner along a straight line is, of course, well known and for the sake of brevity will not be described. The generation of heat along lines 27 localizes the heat and prevents any damage to the substrate 12 or the electronic device 10. On the other hand, if the glass plate 17 were not used, a scan along lines 27 would impinge on the substrate and could cause damage to it, particularly a printed circuit substrate.

The electronic device 10 may be an encapsulated chip having major dimensions of 750 by 750 mils, which may typically have twenty-four leads extending from each side, each lead having a thickness of seven mils and a width of eith mils. It is apparaent that the glass plate can be conveniently used by an operator as an aid for aligning the free ends of the leads with corresponding bonding pads 11. In the interest of clarity, the various bonding pads 11 have not been shown in FIG. 2, but it is to be understood that the substrate 12 contains four rows of bonding pads, upon each of which one of the free ends of leads 14 is to located. It can be appreciated that the apertured glass plate can be of considerable assistance to an operator in appropriately positioning the electronic device on the substrate. On the other hand, the plate can also be a significant aid in assisting automatic or robotic placement, and, for automatic placement, there may not be a need for making the plate 17 transparent to visible light. A different combination of laser wavelength and apertured plate material may then be selected such that the plate converts all or much of the laser light to heat.

Figure 3:
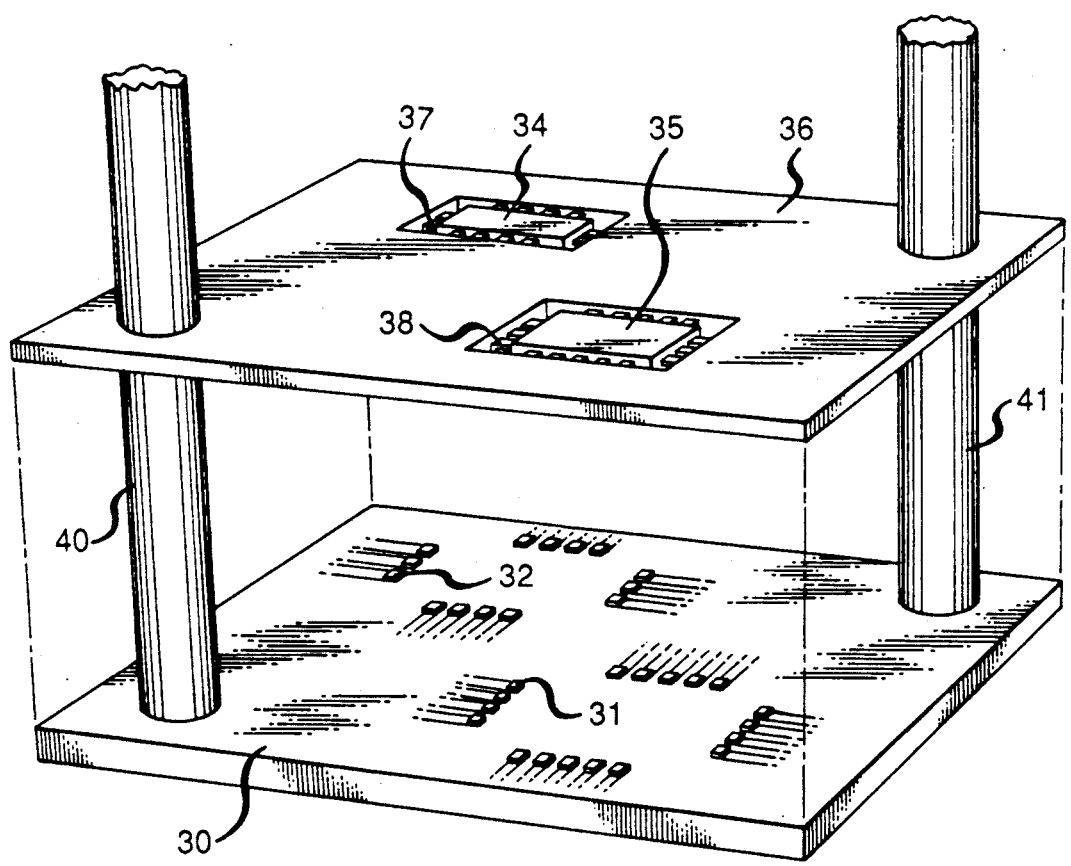
FIG. 3 is a schematic view of apparatus for practicing a soldering process in accordance with another embodiment of the invention.

FIG. 3 illustrates schematically one example of how the invention can be used for automated placement of lead arrays on bonding pad arrays. A substrate 30 contains generally rectangular bonding pad arrays 31 and 32 upon which it is desired to align the lead arrays of electronic devices 34 and 35. A glass plate 36 contains apertures 37 and 38 for respectively holding electronic devices 34 and 35 in the same manner as described previously. Indexing rods 40 and 41 permit vertical movement of the glass plate 36 and assure its predetermined registration with substrate 30. Apertures 37 and 38 are located in glass plate 36 such as to align the lead arrays of devices 34 and 35 respectively, with row arrays 32 and 31 of the substrate 30. Thus, one initially inserts devices 34 and 35 respectively, in apertures 37 and 38 and then lowers the glass plate 36 until the free ends of the lead arrays (not shown) are contacted to the bonding pad arrays 32 and 31. As before, the glass plate presses each lead against a corresponding bonding pad during a laser scan around the periphery of each aperture in the manner depicted in FIG. 2. A stopper member, not shown, may be included above each of the devices, in the manner depicted in FIG. 1 by stopper member 19, for the purpose of holding the devices to the substrate after the soldering operation as the glass plate 36 is removed in an upward direction.

While the electronic devices we have shown have cantilevered leads extending from all four sides, it is apparent that the invention can be used wherever one has an array of leads to be bonded to a corresponding array of bonding pads. The holding action of the apertures on the electronic device does not require the leads extending from all four sides, and it will work quite well if leads were included on only two opposite sides or, perhaps, from one side. One skilled in the art could devise a scanning mechanism to make the laser beam 16 scan along a continuous rectangular line around the periphery of aperture 24. In some instances, the weight of the glass plate could provide sufficient downward force on the leads during the heating operation that other force on it would not be necessary. Various other embodiments and modifications may be made by those skilled in the art without departing from the spirit and scope of the invention.

We claim:

1. A method for surface mounting an electronic device having a plurality of leads extending therefrom in a cantilever fashion to a row of mounting pads on a substrate surface comprising the steps of:

aligning free ends of the leads with the bonding pads such that each lead overlies a bonding pad;

pressing the leads onto the bonding pads with a plate that bridges said plurality of leads so as to force each lead into contact with a corresponding bonding pad;

solder being located between each lead and the bonding pad with which it makes contact;

scanning the plate with a laser beam simultaneously with the pressing step, the plate converting laser beam energy to sufficient heat energy to solder the leads to the bonding pads;

and removing the plate.

2. The method of claim 1 wherein:

part of the surface of each lead is coated with said solder prior to contacting the corresponding bonding pad.

3. The method of claim 1 wherein:

each lead contains first and second substantially right angle bends, a first lead portion extends from the electronic device to the first right angle bend, a second lead portion interconnects the first and second right angle bends, and a third lead portion extends from the second right angle bend and makes contact with a bonding pad;

and the pressing step comprises the step of abutting the plate against the second and third lead portions.

4. The method of claim 3 wherein:

first and second arrays of leads extend from opposite sides of the electronic device;

an aperture is made in the plate;

and the aperture is fitted around the electronic device such that inner surfaces of the plate defining the aperture abut against second lead portions of the leads of the first and second arrays.

5. The method of claim 4 wherein:

the aperture is sized such as to compress slightly the first and second arrays of leads, whereby the electronic device may be suspended in the aperture by friction.

6. The method of claim 1 wherein:

the plate is made of transparent glass, whereby the free ends of the leads can be observed by an operator during the alignment step.

7. The method of claim 1 wherein:

the laser beam is formed by a carbon dioxide laser, and the plate is made of fused silica, whereby the laser beam is efficiently converted to heat energy by the plate.

8. A method for aligning and soldering to an array of bonding pads of a substrate an electronic device having at least first and second arrays of leads extending from opposite sides thereof, each lead having a free end portion adapted to contact a bonding pad and a second portion extending substantially perpendicularly to the free end portion, said method comprising the steps of:

making an aperture in a plate that is sufficiently large to surround the electronic device, but slightly smaller across one dimension than the distance between free end portions of corresponding leads of the first and second arrays;

fitting the aperture over the electronic device such as to compress slightly the leads of the first and second arrays, thereby to support the electronic device by friction;

moving the plate with respect to the bonding pads such as to align each lead with respect to a corresponding bonding pad of the bonding pad array;

pressing the plate in the direction of the substrate such as to bring each lead in firm contact with a corresponding bonding pad;

during the pressing step, scanning the plate with a laser beam to create sufficient heat to solder the leads to the bonding pads;

and removing the plate.

9. The method of claim 8 wherein:

each lead is coated with said solder prior to contacting the corresponding bonding pad.

10. The method of claim 9 wherein:

the plate is a transparent glass plate, whereby, during the alignment step, the operator can see the leads overlapping corresponding bonding pads;

and the laser beam has a wavelength which is converted to heat by the transparent glass.

11. The method of claim 10 wherein:

the electronic device has four sides with second and third arrays of leads extending from opposite sides of the device;

and the aperture is made such as to compress slightly the leads of the third and fourth arrays.

12. The method of claim 11 wherein:

each lead contains first and second substantially right angle bends, a first lead portion extending from the electronic device to the first right angle bend, a second lead portion interconnecting the first and second right angle bends, and a third lead portion extending from the second right angle bend and making contact with a bonding pad;

and the pressing step comprises the step of abutting the plate against the second and third lead portions.

13. The method of claim 8 wherein:

two apertures are made in the plate;

both of the apertures are fitted over electronic devices such as to compress slightly the leads of opposite arrays;

and both electronic devices are arranged such as to align the leads thereof with respect to corresponding bonding pads.

14. The method of claim 8 wherein:

the step of removing the plate comprises the step of abutting a stopper member against the electronic device as the plate is removed from the electronic device, thereby to avoid pulling the soldered leads from the bonding pads.

* * * * *